(12) United States Patent
Sakai

(10) Patent No.: US 6,751,101 B2
(45) Date of Patent: Jun. 15, 2004

(54) ELECTRONIC COMPONENT AND METHOD OF PRODUCING THE SAME

(75) Inventor: Norio Sakai, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/004,229

(22) Filed: Nov. 2, 2001

(65) Prior Publication Data

US 2002/0122301 A1 Sep. 5, 2002

(30) Foreign Application Priority Data

Nov. 2, 2000 (JP) ........................................ 2000-335589

(51) Int. Cl.⁷ .............................. H05K 1/02; H05K 7/02; H01L 23/00
(52) U.S. Cl. ........................ 361/736; 361/748; 361/760; 174/250; 257/678
(58) Field of Search ................................ 361/728, 736, 361/748, 760; 174/250, 255, 260, 262; 257/678, 700

(56) References Cited

U.S. PATENT DOCUMENTS

| | | | |
|---|---|---|---|
| 4,764,233 A | * 8/1988 | Ogihara et al. | 156/89 |
| 4,963,843 A | * 10/1990 | Peckham | 333/203 |
| 5,140,745 A | * 8/1992 | McKenzie, Jr. et al. | 29/852 |
| 5,430,933 A | * 7/1995 | Marx et al. | 29/846 |
| 5,488,765 A | * 2/1996 | Kubota et al. | 29/593 |
| 5,493,769 A | * 2/1996 | Sakai et al. | 29/593 |
| 5,600,101 A | * 2/1997 | Sakai | 174/261 |
| 5,604,328 A | * 2/1997 | Kubota et al. | 174/52.1 |
| 5,625,935 A | * 5/1997 | Kubota et al. | 29/25.42 |
| 5,635,669 A | * 6/1997 | Kubota et al. | 174/52.1 |
| 5,635,670 A | * 6/1997 | Kubota et al. | 174/52.1 |
| 5,644,107 A | * 7/1997 | Kubota et al. | 174/262 |
| 5,752,182 A | * 5/1998 | Nakatsuka et al. | 455/333 |
| 5,966,052 A | * 10/1999 | Sakai | 331/68 |
| 6,046,409 A | * 4/2000 | Ishii et al. | 174/255 |
| 6,278,178 B1 | * 8/2001 | Kwon et al. | 257/684 |
| 6,383,835 B1 | * 5/2002 | Hata et al. | 438/65 |
| 6,576,999 B2 | * 6/2003 | Sakai et al. | 257/730 |
| 6,639,311 B2 | * 10/2003 | Sakai et al. | 257/700 |

FOREIGN PATENT DOCUMENTS

| | | |
|---|---|---|
| JP | 06-096992 | 4/1994 |
| JP | 07-050488 | 2/1995 |
| JP | 07-192960 | 7/1995 |
| JP | 07-192961 | 7/1995 |
| JP | 08-037250 | 2/1996 |
| JP | 08-037251 | 2/1996 |
| JP | 09-186416 | 7/1997 |
| JP | 11-003836 | 1/1999 |
| JP | 11-008157 | 1/1999 |
| JP | 11-330653 | 11/1999 |

* cited by examiner

Primary Examiner—David Martin
Assistant Examiner—Dameon E. Levi
(74) Attorney, Agent, or Firm—Keating & Bennett, LLP

(57) ABSTRACT

An electronic component includes via holes having an elongated cross section, which are provided in a ceramic green molded product provided with a plurality of terminal conductors to define external terminal electrodes. Thereby, a portion of each terminal conductor is exposed on the inner wall of a piecing hole. The ceramic molded product is fired to obtain a ceramic sintered product. Then, the sintered product is split along cutting grooves passing through the via-holes, wherein ceramic electronic components are produced.

18 Claims, 9 Drawing Sheets

ELECTRONIC COMPONENT AND METHOD OF PRODUCING THE SAME

BACKGROUND OF THE INVENTION

1. Field of the Invention

The present invention relates to an electronic component and a method of producing the same, and more particularly to a ceramic electronic component having improved external terminal electrodes and a method of producing the same.

2. Description of the Related Art

FIG. 15 is a perspective view showing a conventional ceramic electronic component 1.

The ceramic electronic component 1 defines a capacitor, an inductor, a resonator, a circuit substrate, or other suitable electronic components. The ceramic electronic component 1 includes a member 2 having a laminated or single-layer structure.

The ceramic electronic component member 2 has a rectangular parallelepiped shape which includes first and second main surfaces 3 and 4 disposed opposite to each other and four side surfaces 5, 6, 7, and 8 connecting the first and second main surfaces 3 and 4. A plurality of external terminal electrodes 9 is provided on at least one side surface of the ceramic electronic component member 2, for example, on the side surfaces 5 and 7. These external terminal electrodes 9 are provided on the inner walls 10 of concavities having a semicircular cross-section provided on the side surfaces 5 and 7.

The ceramic electronic component 1 is produced as follows.

First, a ceramic green molded product 11 as shown in FIG. 16 is produced. When the ceramic electronic component member 2 has a laminated structure, a plurality of ceramic green sheets are laminated to produce the ceramic molded product 11. A plurality of the ceramic electronic components 1 are produced from the ceramic green molded product 11.

Next, a plurality of through-holes 12 are formed in the ceramic green molded product 11 as shown in FIG. 16. The positions of the through-holes 12 correspond to positions where the external terminal electrodes 9 are to be formed.

Moreover, as shown in FIG. 16, cutting grooves 15 are formed on one main surface 13 or on both main surfaces 13 and 14 of the ceramic green molded product 11. FIG. 18 clearly shows that the cutting groove 15 is formed on both of the main surfaces 13 and 14. When a plurality of the ceramic electronic components 1 are produced in a later process, the cutting grooves 15 facilitate breaking along the boundary lines between the plurality of the ceramic electronic components. For example, the cutting grooves 15 are formed to have a depth that is equal to about one third to one sixth of the thickness of the ceramic green molded product 11.

Then, the ceramic green molded product 11 is fired, whereby a ceramic sintered product 16 can be obtained. FIG. 17 is a cross-sectional view of a portion of the ceramic sintered product 16.

Subsequently, electrically conductive paste 17 is applied on the inner walls of the through-holes 12, and thereby, the terminal conductors 18 to be formed into the external terminal electrodes 9 are formed on the inner walls of the through-holes 12, respectively, as shown in FIG. 17. To form each terminal conductor 18, for example, screen printing is performed. That is, the ceramic sintered product 16 is placed on a stand 21 having holes 20 to which a vacuum is applied as shown by arrows 19, with the holes 20 and the through-holes 12 being aligned. The electrically conductive paste 17 is applied onto the inner walls of the through-holes 12 by moving a squeegee 23 over a screen 22.

In the above-described screen printing process, the electrically conductive paste 17 is applied to the main surface 13 of the ceramic sintered product 16 in a desired pattern, if necessary, whereby conductor films for wiring are formed.

Succeedingly, the terminal conductors 18 and the conductor wiring films formed with the conductive paste 17 are fired.

If the ceramic green molded product 11 has a laminated structure, the process illustrated in FIG. 17 is carried out for the ceramic green molded product 11 in the green state. In some cases, the conductive paste 17 forming the terminal conductors 18 and the other wiring conductors are fired together with the ceramic green molded product 11.

Next, the surfaces of the terminal conductors 18 are plated with nickel/gold, nickel/tin, nickel/solder, or other suitable conductive material.

Next, components are mounted on the main surface 13 of the ceramic sintered product 16.

The cutting grooves 15 may be formed after the process illustrated FIG. 17, which is carried out before firing, after the plating process, or after the components are mounted.

The ceramic sintered product 16 having the terminal conductors 18 disposed on the inner walls of the through-hole 12 are formed as described above. FIG. 18 shows a portion of the ceramic sintered product 16.

Then, the ceramic sintered product 16 is broken along the cutting grooves 15, and the plurality of the ceramic electronic components 1 are separated. FIG. 19 is a partially enlarged perspective view of a portion of the separated ceramic electronic component 1. FIG. 19 shows a concavity 10 formed by splitting the through-hole 12 and the external terminal electrode 9 formed by splitting the terminal conductor 18.

When the ceramic sintered product 16 is broken as described above, the terminal conductors 18 are split when tensile stress is applied. Therefore, the splitting forms split surfaces 24 which are exposed on the external terminal electrode 9.

The above-described ceramic electronic component 1 and the method of producing the same have the following problems.

The split surfaces 24 formed on the external terminal electrodes 9 oxidize because they are not plated with the plating film. Thus, the soldering properties of the split surfaces 24 are deteriorated. As a result, satisfactory soldering to the external terminal electrodes 9 is not possible.

Moreover, when the ceramic sintered product 16 are broken along the cutting grooves 15, the through-holes 12 are split in such a manner that the terminal conductors 18 on the inner walls of the through-holes 12 are torn off. Thus, the terminal conductors 18 often do not accurately split into halves along the cutting groove 15. In some cases, severe defects are caused. That is, one of the halves is chipped which causes electrical disconnection. Moreover, a fatal deficiency may be caused. That is, the terminal conductors 18 may be partially chipped together with a portion of the ceramic sintered product 16.

To solve the above-described problems, the thickness of each terminal conductor 18 and that of the plating film formed thereon is decreased. However, the decrease of the thickness causes a defect, such as disconnection.

If the external terminal electrodes 9 are formed after the ceramic sintered product 16 is broken along the cutting grooves 15, the above-described problems are solved. However, in this case, the production efficiency is deteriorated.

Moreover, to solve the above-described problem of chipping of the external terminal electrodes 9 caused when the ceramic sintered product 16 is broken along the cutting grooves 15, the terminal conductors 18 must be hollow, as clearly shown in FIG. 17. Therefore, the diameter of the through-hole 12 cannot be significantly reduced. As a result, the size of the ceramic electronic component 1 cannot be significantly reduced.

As shown in FIG. 17, the terminal conductors 18 are formed to be hollow as described above while the peripheries of the holes 21 of the stand 20 are not smeared with the conductive paste 17. Accordingly, the conductive paste 17 must be screen-printed while a vacuum is applied to the holes 20 each having a diameter larger than the through-holes 12. Thus, portions 25 extending onto the main surfaces 13 and 14 are formed for each of the external terminal electrodes 9. However, the presence of the extended portions 25 prevents substantial reduction of the interval at which the external terminal electrodes 9 are arranged. As a result, a substantial reduction in the size of the ceramic electronic component 1 cannot be achieved.

The characteristics of the ceramic electronic components 1 must be measured before the components 1 are shipped. However, before the ceramic sintered product 16 is broken along the cutting grooves 15, the terminal conductors 18 to be formed into the external terminal electrodes 9 of a ceramic electronic component 1 are continuous to those of the adjacent ceramic electronic component 1 in the sintered product 16. Thus, the characteristics of each ceramic electronic component 1 cannot be measured before the ceramic sintered product 16 is broken along the cutting grooves 15. Thus, the measurement of the characteristics cannot be efficiently performed.

If the ceramic electronic component 1 is used as a circuit board, other electronic components may be mounted onto the main surface 3 or 4 of the ceramic electronic component member 2. In this case, the mounting of the electronic components onto the ceramic sintered product 16 is more efficient. However, the characteristics of each of the ceramic electronic components 1 cannot be measured, when the components are present in the form of the assembled electronic component. Thus, the electronic components are mounted on defective ceramic electronic components as well as acceptable ceramic electronic components. This increases the cost of manufacturing the electronic components.

SUMMARY OF THE INVENTION

To overcome the above-described problems, preferred embodiments of the present invention provide a greatly improved electronic component and a method of producing the same.

According to a first preferred embodiment of the present invention, an electronic component includes a member having first and second main surfaces opposite to each other, and four side surfaces connecting the first and second main surfaces, at least one of the side-surfaces being provided with a recess portion extending from the first main surface to the second main surface, and a plurality of external terminal electrodes arranged in the recess portion.

The external terminal electrodes are arranged to extend from the first main surface to the second main surface, or may be arranged to extend from the first main surface, but not reaching the second main surface.

Preferably, a plurality of concavities are arranged in the recess portion, and the external terminal electrodes are arranged so as to be filled into the concavities, and the surface of the external terminal electrodes have a common flat surface with the bottom surface of the recess portion.

The member of the electronic component has a laminated structure or a single layer structure. If the member of the electronic component has a laminated structure, the member includes a plurality of ceramic layers laminated together, and an internal conductor film provided on a desired interface between the ceramic layers.

Preferably, an external conductor film is provided on at least one of the first and second main surfaces of the member of the electronic component.

Preferably, the external terminal electrodes each have a portion extending onto at least one of the first and second main surfaces.

The surface of each external terminal electrode is preferably entirely covered with a plating film.

Moreover, another preferred embodiment of the present invention provides a method of producing an electronic component.

According to a second preferred of the present invention, a method of producing an electronic component includes the steps of preparing a ceramic green molded product having a plurality of terminal conductors to be formed into external terminal electrodes and extending in the thickness direction over at least a portion of the thickness thereof, forming a via-hole having an elongated cross section along a line on which the plurality of the terminal conductors of the ceramic green molded product are arranged, the via-hole piercing the ceramic green molded product between the first and second main surfaces thereof opposite to each other, wherein a portion of each of the plurality of the terminal conductors is exposed on the inner surface of the via-hole, firing the ceramic green molded product to obtain a ceramic sintered product, and splitting the ceramic sintered product along a split line passing through the via-hole, wherein the terminal conductors exposed on the inner surface of the via-hole are arranged in a recess portion formed by splitting the via-hole, and the ceramic electronic component is separated from the ceramic green molded product.

In the case in which the electronic component has a laminated structure, preferably, the step of preparing the ceramic green molded product includes laminating ceramic green sheets having a plurality of the terminal conductors provided in the thickness direction thereof so as to pass through the ceramic green molded product.

Moreover, the step of preparing the ceramic green molded product may further include forming conductor films and via-hole conductors for wiring on and in the ceramic green sheets.

According to a third preferred embodiment of the present invention, a method of producing an electronic component includes the steps of preparing a ceramic green molded product, forming a via-hole having an elongated cross section which pierces the ceramic green molded product between the first and second main surfaces opposite to each other, firing the ceramic green molded product to obtain a ceramic sintered product, forming a plurality of external terminal electrodes on the ceramic green molded product or the ceramic sintered product so as to be arranged on the inner surface of the via-hole, and splitting the ceramic sintered molded product along a split line passing through the via-hole, whereby the plurality of the external electrodes formed on the inner wall of the via-hole are arranged in a recess portion formed by splitting the via-hole, and the ceramic electronic component is separated.

In the case in which the electronic component has a laminated structure, the step of preparing the ceramic green molded product includes laminating a plurality of ceramic green sheets.

Preferably, the step of preparing the ceramic green molded product includes forming a conductor film or a via-hole conductor for wiring.

According to the second and third preferred embodiments of the present invention, preferably, the ceramic sintered product is an assembled electronic component from which a plurality of the electronic components are separated, the step of splitting the ceramic sintered product includes splitting the assembled electronic component, and in the step of forming the via-hole, the via-hole is formed so as to split the terminal conductors. Specifically, according to the second preferred embodiment of the present invention, in the step of forming the via-hole, the via-hole is formed so as to split the terminal conductors.

Preferably, the method of producing a ceramic electronic component further includes the step of measuring the characteristics of each of the ceramic electronic components in the state of the assembled electronic component before the step of splitting the assembled electronic component.

Also preferably, the method of producing a ceramic electronic component further includes the step of plating the surfaces of the external terminal electrodes before the step of splitting the ceramic sintered product.

The present invention is also intended for a ceramic electronic component obtained by the above-described method of producing the ceramic electronic component.

Other features, elements, characteristics, and advantages of the present invention will become more apparent from the following detailed description of the preferred embodiments of the present invention with reference to the attached drawings.

DETAILED DESCRIPTION OF PREFERRED EMBODIMENTS

Figure 1:
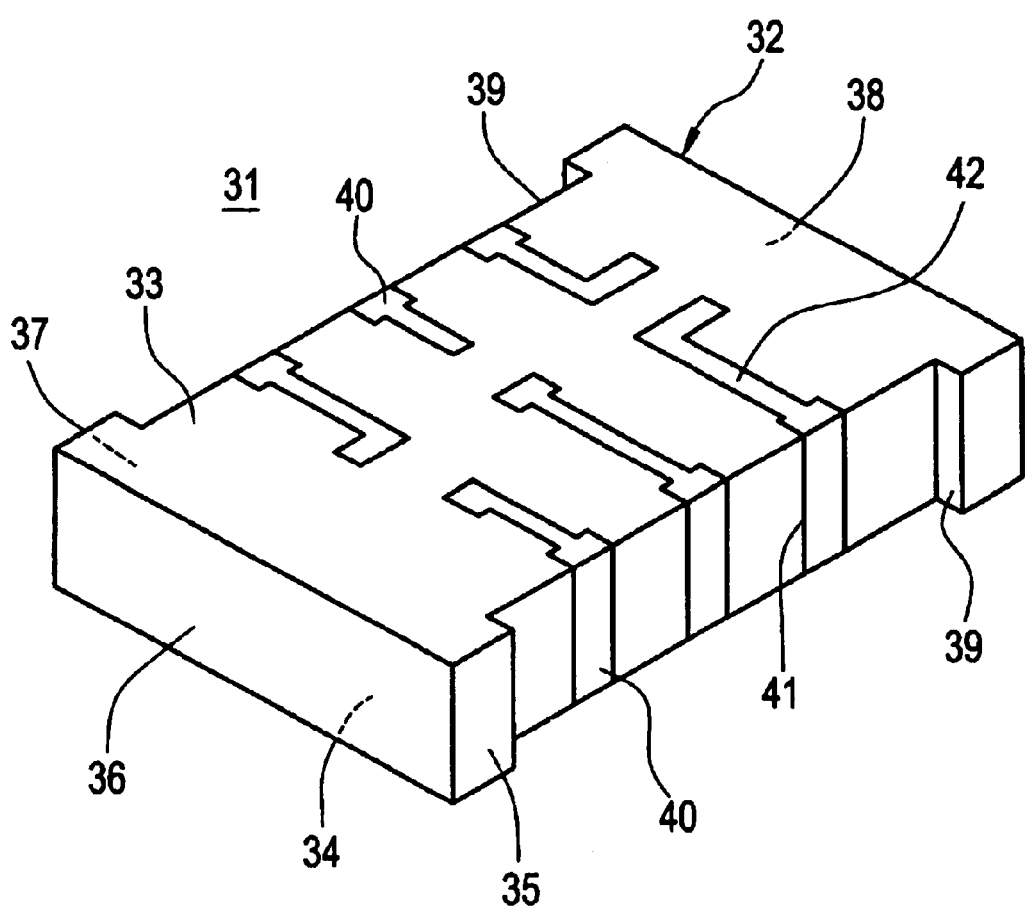
FIG. 1 is a perspective view showing a ceramic electronic component according to a preferred embodiment of the present invention.

FIG. 1 is a perspective view showing a ceramic electronic component 31 according to a preferred embodiment of the present invention.

The ceramic electronic component 31 preferably includes a member 32 having first and second main surfaces 33 and 34 disposed opposite to each other and four side surfaces 35, 36, 37, and 38 connecting the first and second main surfaces 33 and 34.

At least one side surface of the ceramic electronic component member 32, for example, the side surfaces 35 and 36 are provided with recess portions 39 that extend from the first main surface 33 to the second main surface 34. A plurality of external terminal electrodes 40 is arranged in each recess portion 39. In addition, the surface of the external terminal electrodes 40 has a common flat surface with the bottom surface of the recess portion 39.

In this preferred embodiment, the external terminal electrodes 40 are arranged so as to extend from the first main surface 33 to the second main surface 34. A plurality of concavities 41 are arranged in the recess portion 39. The external terminal electrodes 40 fill the concavities 41.

A desired number of external conductor films 42 are provided on the first main surface of the electronic component member 32. The external conductor films 42 are electrically connected to respective external terminal electrodes 40. Components (not shown) are mounted on the main surface 33 so as to be electrically connected to the external conductor films 42. Moreover, a cap is mounted on the main surface 33 to cover the mounted components.

The external conductor films may be also provided on the second main surface 34 of the electronic component member 32, though not shown in FIG. 1.

Preferably, the exposed-surfaces of the external terminal electrodes 40 are entirely coated with a plating film.

To produce the above-described ceramic electronic component 31, processes are performed as described below with reference to FIGS. 2A to 4. The method of producing the ceramic electronic component 31 described below is directed to the electronic component member 32 having a laminated structure.

Figure 2A:
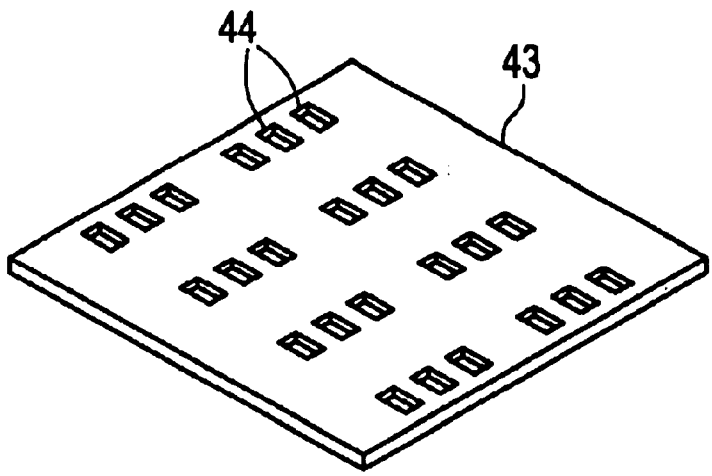
FIGS. 2A and 2B are perspective views of a ceramic green sheet to be prepared for production of the ceramic electronic component shown in FIG. 1, and illustrate the processes which are sequentially carried out on the ceramic green sheet.

First, a ceramic green sheet 43 is prepared as shown in FIG. 2A. A plurality of through-holes 44 are formed so as to be arranged at desired positions. In this preferred embodiment, the through-holes 44 each preferably has a substantially a rectangular cross-section.

Figure 2B:
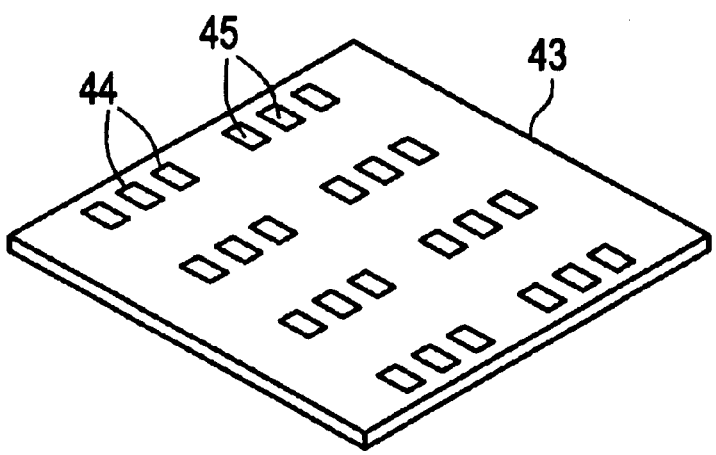

Electrically conductive paste is filled into the respective through-holes 44, as shown in FIG. 2B. Thus, terminal conductors 45 are arranged to pass through the ceramic green sheet 43 in the thickness direction.

Figure 2C:
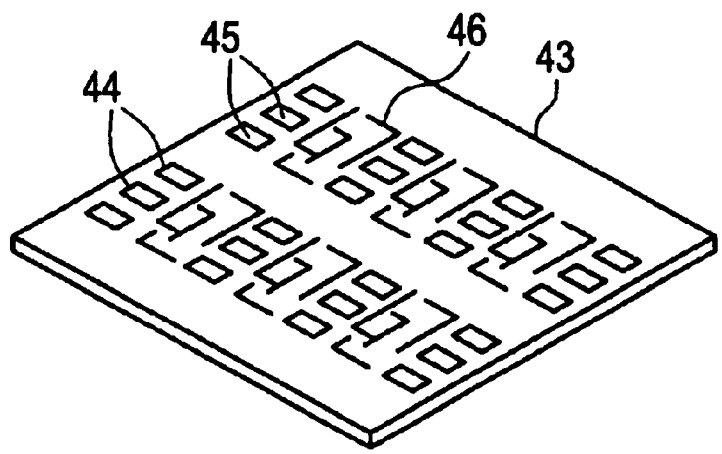

Succeedingly, electrically conductive paste is applied on the ceramic green sheet 43, e.g., by screen printing, as shown in FIG. 2C. Thus, conductor films 46 for wiring are arranged in a desired pattern. The conductor films 46 may become the above-described external conductor films 42 or internal conductor films, depending upon the locations of the ceramic green sheet 43 when it is laminated.

The conductor films 46 are formed simultaneously when the process of filling the through-holes 44 with the conductive paste for formation of the terminal conductors 45 is performed.

Via-hole conductors for wiring are formed in the ceramic green sheet 43, though not shown in FIGS. 2A to 2C. Through-holes for forming the via-hole conductors may be formed simultaneously when the process of forming the through-holes 44 shown in FIG. 2B is performed.

Figure 3A:
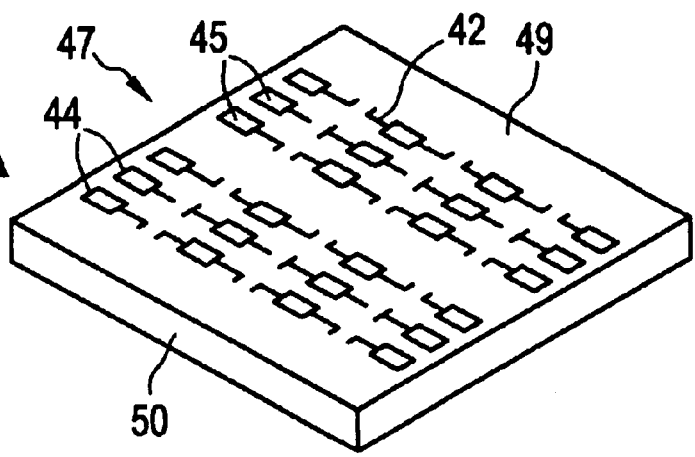
FIGS. 3A and 3B are perspective views of a ceramic green molded product obtained by laminating a plurality of ceramic green sheets including the ceramic green sheet shown in FIG. 2, and illustrate the processes which are sequentially carried out on the ceramic green molded product.

Succeedingly, a plurality of ceramic green sheets including the ceramic green sheet 43 are laminated and pressed in the lamination direction. Thus, a ceramic green molded product 47 shown in FIG. 3A is prepared. The plurality of the terminal conductors 45 are arranged so as to extend in the ceramic green molded product 47 over at least a portion of the thickness thereof. In this preferred embodiment, the terminal conductors 45 are arranged so as to pass through the ceramic green molded product 47 in the thickness direction thereof.

Next, via-holes 48 having an elongated cross section are formed along lines on the ceramic green molded product 47 along which the plurality of the terminal conductors 45 are arranged. The via-holes 48 pierce the ceramic green molded product 47 between the first and second main surfaces 49 and 50 opposite to each other.

The plurality of the terminal conductors 45 are individually split by the formation of the via-holes 48 described above, as shown in the enlarged view of FIG. 5. A portion of each of the plurality of the terminal conductors 45 formed by splitting is exposed on the inner surface of the piecing hole 48. The portion of each terminal conductor 45 formed by splitting defines the external terminal electrode 40.

Figure 3B:
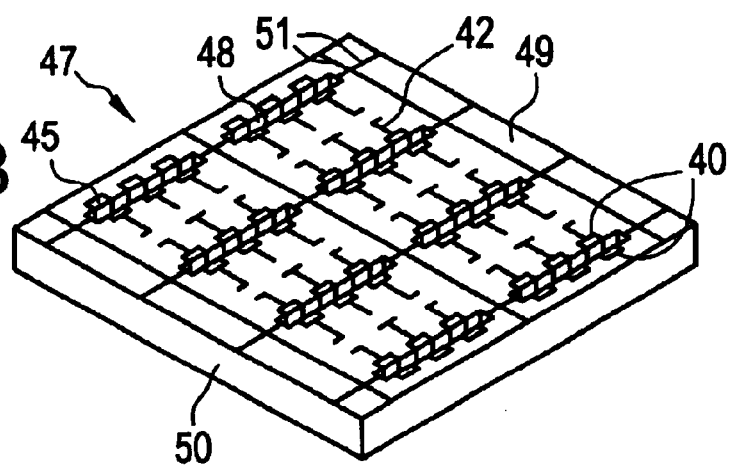

Next, cutting grooves 51 are formed on one main surface 49 or on both the main surfaces 49 and 50 of the ceramic green molded product 47 as shown in FIG. 3B. The cutting grooves 51 are formed along split lines formed for splitting in a later process. Special cutting grooves 51 are positioned to pass through the via-holes 48 having an elongated cross section. The cutting grooves 51 are formed, for example, to have a depth equal to about one third to one sixth the thickness of the ceramic green molded product 47.

Figure 4:
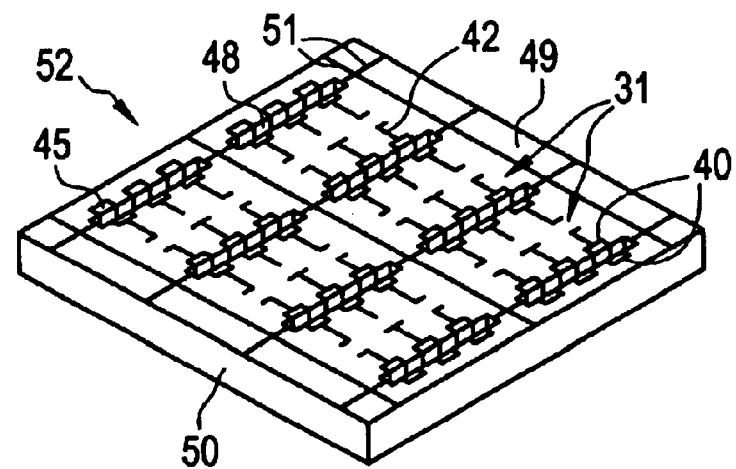
FIG. 4 is a perspective view of a ceramic sintered product obtained by sintering the ceramic green molded product shown in FIG. 3B.

Next, the ceramic green molded product 47 is fired, whereby a ceramic sintered product 52 shown in FIG. 4 is obtained. At the firing, the conductive paste applied to form the terminal conductors 45 is also sintered. The ceramic sintered product 52 has substantially the same shape and size as the ceramic green molded product 47 except that the ceramic sintered product 52 shrinks due to the firing.

Succeedingly, the surfaces of the external terminal electrodes 42 formed by splitting the terminal conductors 45 are plated with nickel/gold, nickel/tin, nickel/solder, or other suitable conductive material. In this plating process, the external conductor films 42 formed on the outer surfaces of the ceramic sintered product 52 may be also plated.

The above-described process produces ceramic electronic components 31 on the respective areas divided by the cutting grooves 51 formed along the split lines on the ceramic sintered product 52. These ceramic electronic components 31 are electrically independent from each other. Accordingly, the characteristics of the individual ceramic electronic components 31 can be measured using the external terminal electrodes 40 as terminals, which are formed by splitting the terminal conductors 45.

Other electronic components are mounted onto the ceramic electronic components 31 which are measured and determined to have acceptable characteristics, and subsequently, the electronic components are capped.

Next, to separate the plurality of the ceramic electronic components 31 from each other, the ceramic sintered product 52 is broken along the cutting grooves 51.

Thus, the ceramic electronic component 31 shown in FIG. 1 is obtained. Each of the plurality of the external terminal electrodes 40 of the ceramic electronic component 31 includes a portion of the terminal conductor 45 exposed on the inner surface of the via-hole 48. The recess portions 39 are formed by splitting the via-holes 48. The plurality of the external terminal electrodes 40 are arranged in each recess portion 39.

A modification of the preferred embodiment described above is described below.

Figure 5:
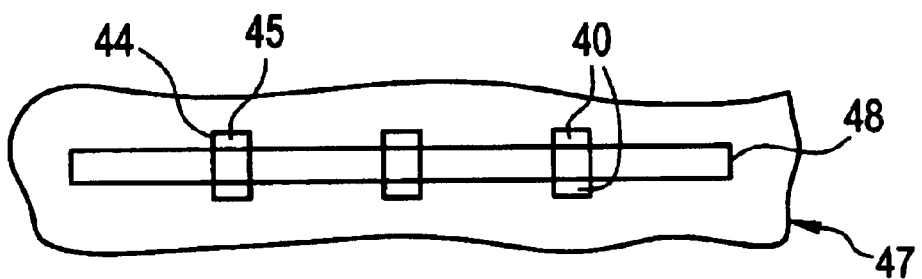
FIG. 5 is a partially enlarged plan view of the ceramic green molded product shown in FIG. 3B.
Figure 6:
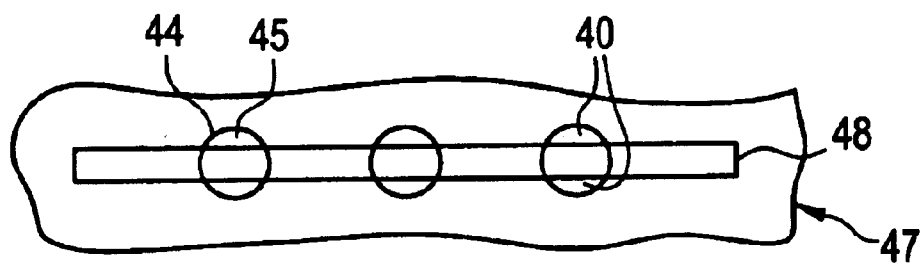
FIG. 6 is a partially enlarged plan view of the portion of a ceramic green molded product corresponding to that shown in FIG. 5, and illustrates a modification of the terminal conductors.

In the above-described preferred embodiment, the terminal conductor films 45 to be formed into the external terminal electrodes 40 are provided in the through-holes 55 having a substantially rectangular cross section, as shown in FIG. 5. The terminal conductor films 45 to be formed into the external terminal electrodes 40 are provided in the through-holes 44 each having a substantially circular cross section, as shown in FIG. 6. Moreover, the through-holes 44 may have a cross section other than substantially circular.

Referring to FIG. 6, the elements equivalent to those shown in FIG. 5 are designated by the same reference numerals, and the repetitive description is omitted.

Figure 7:
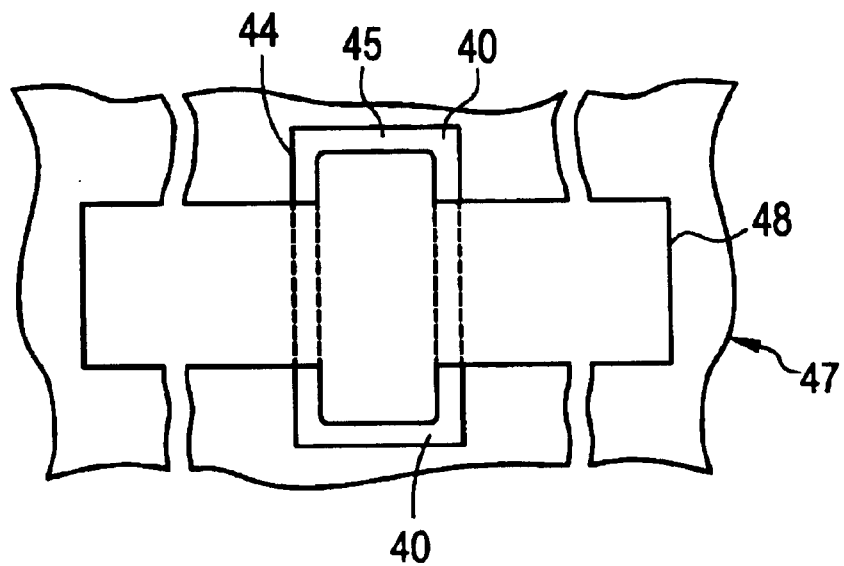
FIG. 7 is a plan view of a portion of the ceramic green molded product shown in FIG. 5, and illustrates another modification of the terminal conductor.

Moreover, in the above-described preferred embodiment, the terminal conductors 45 are arranged to fill the through-holes 44. Each terminal conductor 45 may have a hollow portion in the approximate center portion thereof, that is, so as to be along the inner wall of the through-hole 44. In FIG. 7, the elements equivalent to those shown in FIG. 5 are designated by the same reference numerals, and the repetitive description is omitted.

In FIG. 1, the second main surface 34 of the electronic component member 32 is not illustrated. Each of the external terminal electrodes 40 may be provided with an extended portion 53 that extends onto the second main surface 34 of the electronic component member 32.

The extended portions 53 increase the soldering areas of the external terminal electrodes 40 to which conductive lands on a printed circuit board (not shown) are soldered. Therefore, the extended portions 53 are effective in enhancing the bonding strength between the ceramic electronic component 31 and the circuit substrate.

The extended portions 53 may be formed by screen-printing electrically conductive paste on the ceramic green molded product 47 or the ceramic sintered product 52. The extended portions 53 may be provided on the first main surface 33 of the electronic component member 32.

Figure 8:
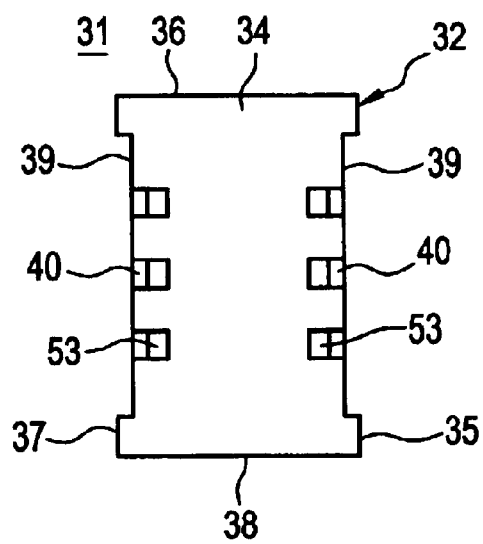
FIG. 8 is a bottom view of a modification of the ceramic electronic component.

In FIG. 8, the elements equivalent to those shown in FIG. 1 are designated by the same reference numerals and repetitive description is omitted.

Figure 9:
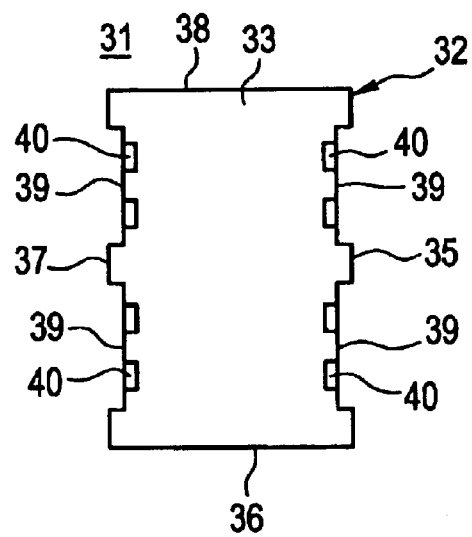
FIG. 9 is a plan view of a further modification of a ceramic electronic component.

In the above-described preferred embodiment, one recess portion 39 is provided on each of the side surfaces 35 and 37 of the electronic component member 32. Two recess portions 39 may be provided for each of the side surfaces 35 and 37, as shown in FIG. 9. Thus, the number of the recess portions 39 may be changed as desired.

In FIG. 9, the external conductor films 42 are not shown, and the elements equivalent to those shown in FIG. 1 and so forth are designated by the same reference numerals. Repetitive description is omitted.

Moreover, in the above-described preferred embodiment, the external terminal electrodes 40 are arranged so as to extend from the first main surface 33 to the second main surface 34 of the electronic component member 32. Alternatively, the external terminal electrodes 40 shown in FIGS. 10, 11, and 12 may be formed so as not to extend to the fist and second main surfaces 33 and 34.

Figure 10:
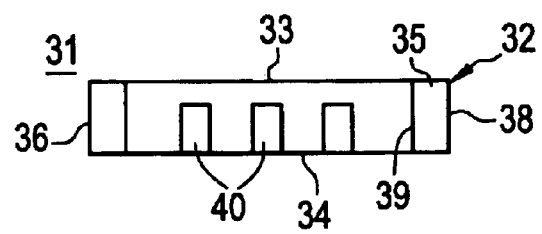
FIG. 10 is a front view of still a further modification of the ceramic electronic component.

In FIG. 10, the external terminal electrodes 40 do not extend to the first main surface 33.

Figure 11:
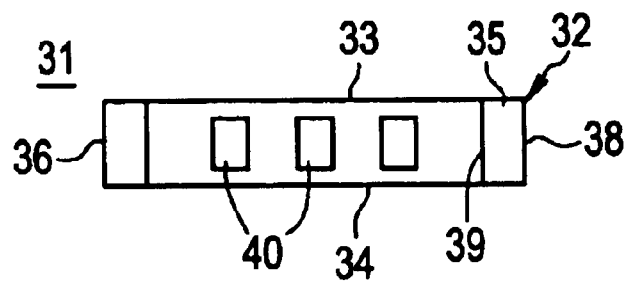
FIG. 11 is a front view of another modification of the ceramic electronic component.

In FIG. 11, the external terminal electrodes 40 do not extend to the first and second main surfaces 33 and 34.

Figure 12:
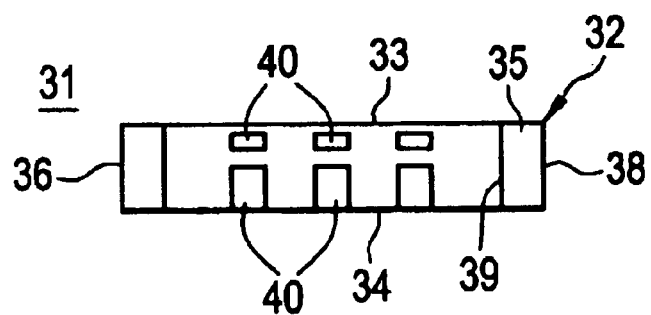
FIG. 12 is a front view of yet another modification of the ceramic electronic component.

In FIG. 12, each external terminal electrode 40 does not extend to the first main surface 33, and also, each external terminal electrode 40 is separated into two portions in the thickness direction of the electronic component member 32.

The external terminal electrodes 40 configured as shown in FIGS. 10 to 12 may be formed as follows. The ceramic green sheets 43 having the terminal conductors 45 shown in FIG. 2 and ceramic green sheets not having the above-described terminal conductors are laminated in a desired order in the lamination process to obtain the ceramic green molded product 47.

The external terminal electrodes 40 shown in FIGS. 10 to 12 are arranged so as not to extend to the first main surface 33 of the electronic component member 32. Thus, the area on the first main surface 33 on which electronic components are mounted is greatly increased. When the ceramic electronic component 31 is mounted on a printed circuit board by soldering, solder fillets are formed to cover the external terminal electrodes 40. The heights of the solder fillets are controlled. If the ceramic electronic component 31 is used in a high frequency circuit, the solder fillets function as an inductance component. Accordingly, by controlling the heights of the solder fillets as described above, the inductance component itself and variations in the inductance component are greatly reduced.

Specifically, the external terminal electrodes 40 shown in FIG. 11 are arranged so as not to extend to the second main surface 34 of the electronic component member 32. Thus, undesirable short-circuiting is effectively prevented between the ceramic electronic component 31 and the conductive lands on a printed circuit board onto which the ceramic electronic component 31 is mounted.

Referring to the external terminal electrodes 40 shown in FIG. 12, the portion of each electrode 40 positioned near the second main surface 34 is used for soldering to the printed circuit board, while the portion of each electrode 40 positioned near the first main surface 33 is used for soldering a cap which is mounted to cover the first main surface 22.

Moreover, in the above-described preferred embodiment, the cutting grooves 51 are formed on the ceramic green molded product 47 before it is fired. The process of forming the cutting grooves 51 may be optionally altered. For example, the cutting grooves 51 may be formed on the ceramic sintered molded product 52 after sintering. In this case, to form the cutting grooves 51, a laser and a scriber provided with a diamond blade are utilized.

In the electronic component member 31 shown in FIG. 1, the recess portions 39 and the external terminal electrodes 40 are provided on the side surfaces 35 and 37 only. However, the recess portions and the external terminal electrodes may be further provided on the side surfaces 36 and 38. Moreover, the recess portions 39 and the external terminal electrodes 40 may be provided on any one of the side surfaces 35 to 38.

In the above-described preferred embodiment, the electronic component member 32 has a laminated structure. The above-described method of producing the ceramic electronic component can be performed even if the ceramic electronic component includes an electronic component member having a single layer structure. In this case, the above-described method of producing the ceramic electronic component described with reference to FIGS. 3 and 4 is applied to a ceramic green molded product having substantially the same configuration as the ceramic green sheet 43 shown in FIG. 2.

In the above-described preferred embodiment, in production of the ceramic electronic component 31, the ceramic sintered product 52, which is an assembled ceramic electronic component 31, is produced and split, such that the plurality of the ceramic electronic components 31 are divided and separated. Alternatively, a ceramic sintered product for the production of a single ceramic electronic component may be produced, in which the ceramic sintered component is split along split lines passing through the via-holes having an elongated cross section such that the periphery of the ceramic sintered product is removed. Thus, the single ceramic electronic component is obtained. In this case, it is not necessary to form the via-holes each having an elongated cross section such that the terminal conductors can be split. The piecing holes each having an elongated cross section may be simply provided such that a portion of each terminal conductor is exposed on the inner surface of the via-hole.

Moreover, in the above-described preferred embodiment, the terminal conductors 45 are formed into the external terminal electrodes 40 previously provided for the ceramic green molded product 47. Alternatively, the method of forming the external terminal electrodes may be changed as follows.

Figure 13:
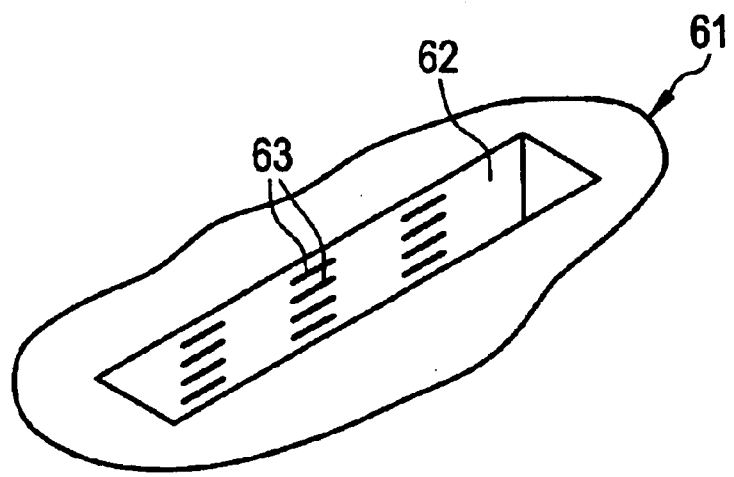
FIG. 13 is a perspective view of a portion of a ceramic green molded product that illustrates a method of producing a ceramic electronic component according to a preferred embodiment of the present invention.

A ceramic green molded product 61 not provided with the terminal conductors is formed as shown in FIG. 13. Via-holes 62 having an elongated cross section are formed so as to pierce the ceramic green molded product 61 between the first and second main surfaces opposite to each other. Internal conductor films 63 formed inside the ceramic green molded product 61 are partially exposed on the inner surface of the via-hole 62.

Referring to the production of the above-described ceramic green molded product 61, a plurality of ceramic green sheets are laminated. Conductor films and via-holes for wiring are provided in the respective ceramic green sheets. The internal conductor films 63 shown in FIG. 13 are portions of the above-described conductor films for wiring.

Figure 14:
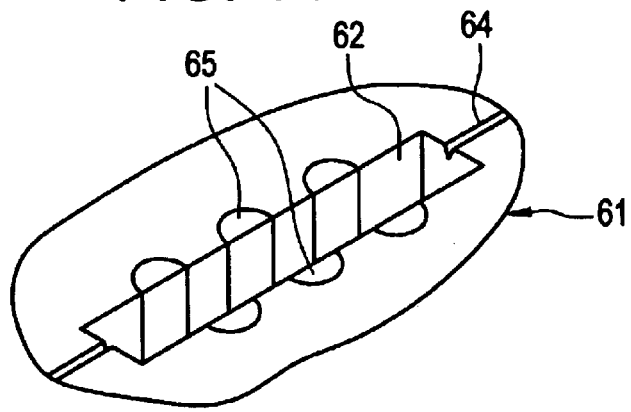
FIG. 14 is a perspective view of the ceramic green molded product shown in FIG. 13, having external terminal electrodes provided thereon.
Figure 15:
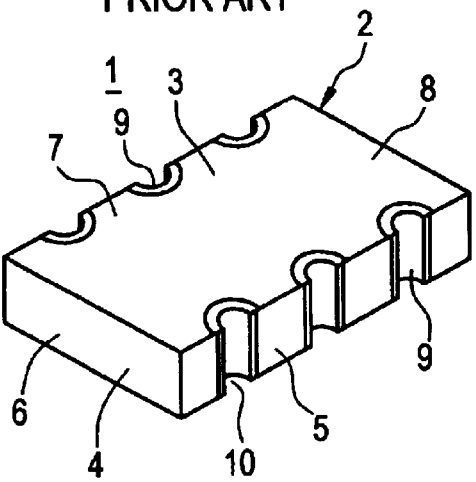
FIG. 15 is a perspective view of a conventional ceramic electronic component.
Figure 16:
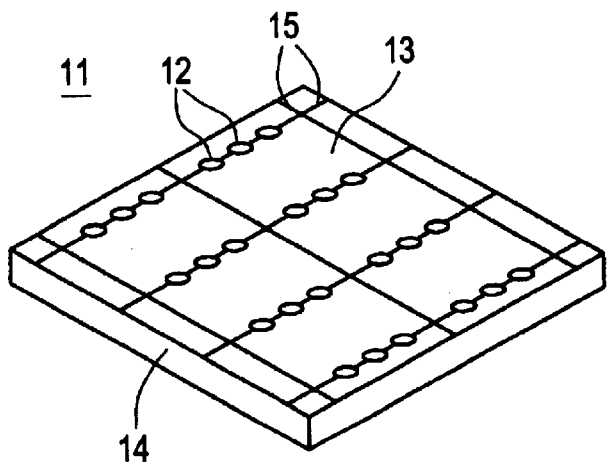
FIG. 16 is a perspective view of a ceramic green molded product prepared for production of the ceramic electronic component shown in FIG. 15.
Figure 17:
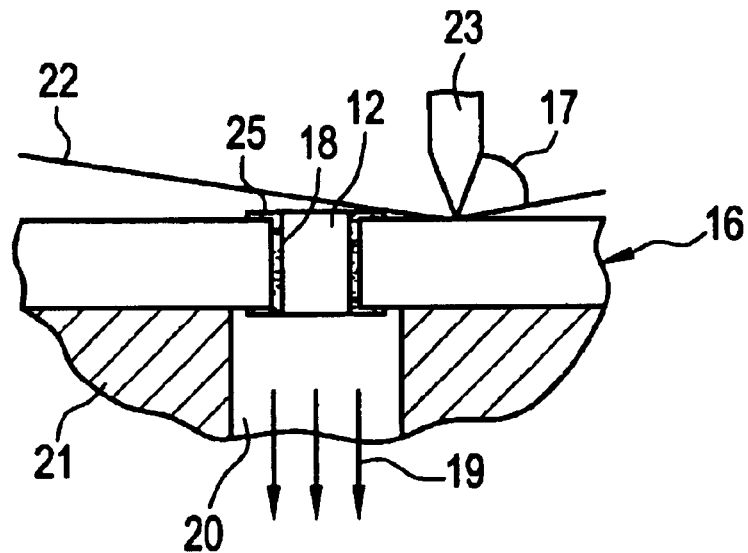
FIG. 17 is a cross sectional view of a ceramic sintered product obtained by sintering the ceramic green molded product, and illustrates the process in which the terminal conductors are provided on the ceramic sintered product.
Figure 18:
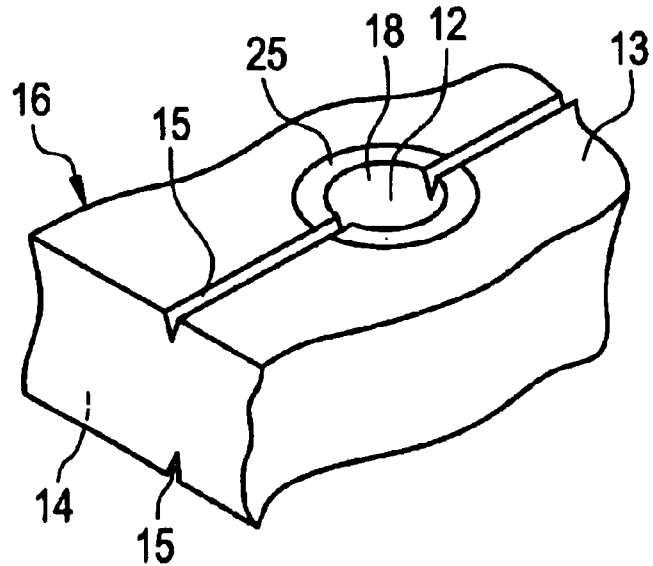
FIG. 18 is a perspective view of a portion of the ceramic sintered product having the terminal conductor provided thereon as shown in FIG. 17.
Figure 19:
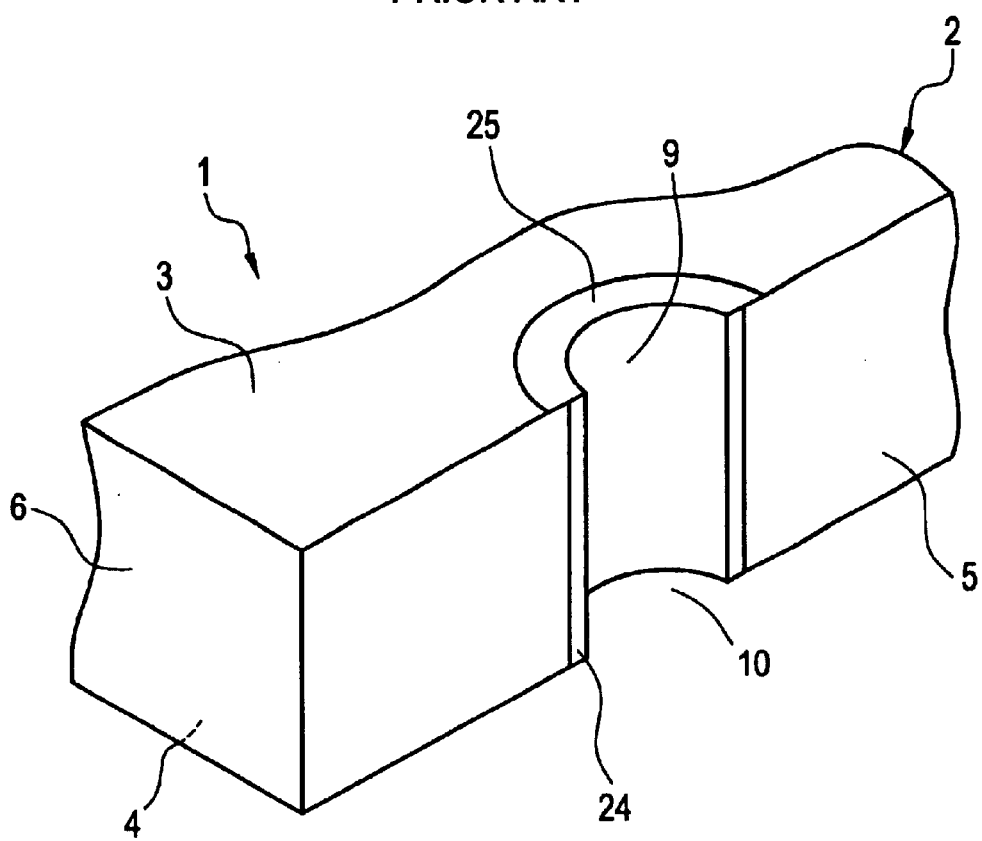
FIG. 19 is a perspective view of a portion of the ceramic electronic component obtained by splitting the ceramic sintered product shown in FIG. 18.

Succeedingly, cutting grooves 64 are formed on the first and second main surfaces along lines passing through the via-holes 62 in the ceramic green molded product 61, as shown in FIG. 14.

A plurality of external terminal electrodes 65 are formed so as to be arranged on the inner surfaces of each via-hole 62 before or after the cutting grooves 64 are formed. The external terminal electrodes 65 are formed so as to be electrically connected to the internal conductor films 63. The external terminal electrodes 65 are preferably formed with electrically conductive paste. The conductive paste is applied by screen printing or by use of a dispenser or other suitable application method.

Next, the ceramic green molded product 61 is fired to obtain a ceramic sintered product. At this time, the conductive paste applied to form the external terminal electrodes 65 is sintered.

Next, the surfaces of the external terminal electrodes 65 are plated with nickel/gold, nickel/tin, nickel/solder, or other suitable conductive material.

Succeedingly, the ceramic sintered product is broken along the cutting grooves 64, and the plurality of the ceramic electronic components 31 are separated. In each ceramic electronic component 31, the plurality of external terminal electrodes 65 formed on the inner surface of each via-hole 62, after the piecing hole 62 is split, are arranged on the recess portion formed by the splitting.

In the above-described method of producing the ceramic electronic component, the formation of the external terminal electrodes 65 may be carried out on the ceramic sintered product after the sintering. In this case, the external terminal electrodes 65 must be baked in a separate step from the sintering step.

The above-described method is applied to the production of the ceramic electronic component provided with the electronic component member having a laminated structure. Therefore, the ceramic green molded product 61 is formed by laminating a plurality of ceramic green sheets. This method may be applied to production of a ceramic electronic component provided with an electronic component member having a single layer structure. In this case, the process of laminating ceramic green sheets to produce the ceramic green molded product 61 is not necessary.

In this preferred embodiment, the characteristics of each of the ceramic electronic components contained in the ceramic sintered product are measured.

As described above, in the ceramic electronic component of the present invention, at least one of the side surfaces of the member of the ceramic electronic component is provided with a recess portion extending from the first main surface to the second main surface, and a plurality of external terminal electrodes are arranged in the recess portion. Thus, the ceramic electronic component can be produced by the method of producing the ceramic electronic component according to one of the second and third preferred embodiments of the present invention.

The method of producing a ceramic electronic component according to the second preferred of the present invention includes the steps of preparing a ceramic green molded product having a plurality of terminal conductors to be formed into external terminal electrodes and extended in the thickness direction over at least a portion of the thickness thereof, forming a via-hole having an elongated cross section along a line on which the plurality of the terminal conductors of the ceramic green molded product are arranged, the via-hole piercing the ceramic green molded product between the first and second main surfaces opposite to each other, wherein a portion of each of the plurality of the terminal conductors is exposed in the via-hole, firing the ceramic green molded product to obtain a ceramic sintered product, and splitting the ceramic sintered product along a splitting line passing through the via-hole, wherein the terminal conductors exposed on the inner surface of the via-hole are arranged in a recess portion formed by splitting the via-hole, and the ceramic electronic components are divided. Thus, the following advantages can be obtained.

When the ceramic sintered product is split, deficiencies such as breaking and peeling of the external terminal electrodes are eliminated. Thus, the qualities of the obtained ceramic electronic component are greatly improved.

Moreover, the size and arrangement pitch of the terminal conductors to be formed into the external terminal electrodes is greatly decreased. The external terminal electrodes are formed such that no portion thereof extends onto a main surface. Accordingly, the external terminal electrodes are provided at a high density. Thus, the ceramic electronic component is greatly reduced in size, and the density of wirings is greatly improved.

When the plating film is provided on the external terminal electrodes, the plating film is maintained after the ceramic sintered product is split. Thus, the external terminal electrodes do not oxidize, and the soldering properties are not deteriorated.

When the ceramic sintered product is an assembled electronic component that is split to produce a plurality of the ceramic electronic components, the external terminal electrodes for a ceramic electronic component are electrically independent from those for other ceramic electronic components. Thus, the characteristics of each of the ceramic electronic components can be measured while the electronic components are in the state of the assembled electronic component. Thus, the process of measuring the characteristics is efficiently performed. Moreover, later processing of rejected products is prevented.

The method of producing a ceramic electronic component according to the third preferred embodiment of the present invention includes the steps of preparing a ceramic green molded product, forming a via-hole having an elongated cross section which pierces the ceramic green molded product between the first and second main surfaces opposite to each other, firing the ceramic green molded product to obtain a ceramic sintered product, forming a plurality of external terminal electrodes on the ceramic green molded product or the ceramic sintered product so as to be arranged on the inner surface of the via-hole, and splitting the ceramic sintered molded product along a split line passing through the via-hole, wherein the plurality of the external electrodes disposed on the inner surface of the via-hole are arranged in a recess portion formed by splitting the via-hole, and the ceramic electronic components can be divided.

Accordingly, the same advantages as those of the method of producing a ceramic electronic component according to the second preferred embodiment of the present invention are obtained, although the size and the arrangement pitch of the external terminal electrodes can be reduced to a lesser degree as compared to those of the method of producing a ceramic electronic component according to the second preferred embodiment of the present invention.

According to the method of producing a ceramic electronic component according to the second preferred of the present invention, the external terminal electrodes can be formed so as not to extend through the member of the ceramic electronic component from the first main surface to the second main surface. When the external terminal electrodes are produced to have the above-described configuration, the heights of solder fillets provided thereon can be controlled. Therefore, when the ceramic electronic component is used in a high frequency circuit, the characteristics are stabilized.

While the present invention has been particularly shown and described with reference to preferred embodiments thereof, it will be understood by those skilled in the art that the foregoing and other changes in form and details can be made without departing from the spirit and scope of the present invention.

What is claimed is:

1. An electronic component comprising:
   a member having first and second main surfaces disposed opposite to each other, and four side surfaces connecting the first and second main surfaces, at least one of the side surfaces being provided with a recess portion extending from the first main surface to the second main surface; and
   a plurality of external terminal electrodes provided in the recess portion; wherein
   a plurality of concavities are provided in the recess portion, the external terminal electrodes are arranged so as to completely fill the concavities, and surfaces of the plurality of external terminal electrodes have a common flat surface with a surface of the recess portion; and
   said plurality of external terminal electrodes are defined by split via hole conductors which extend in a direction that is substantially parallel to respective side surfaces of said member.

2. The electronic component according to claim 1, wherein each of the plurality of external terminal electrodes are arranged so as to extend from the first main surface to the second main surface.

3. The electronic component according to claim 1, wherein each of the plurality of external terminal electrodes are arranged so as to extend from the first main surface towards to second main surface but not reaching the second main surface.

4. The electronic component according to claim 1, wherein the member comprises a plurality of ceramic layers laminated together, and an internal conductor film provided on an interface between the ceramic layers.

5. The electronic component according to claim 1, further comprising an external conductor film provided on at least one of the first and second main surfaces.

6. The electronic component according to claim 1, wherein each of the plurality of external terminal electrodes has a portion extending onto at least one of the first arid second main surfaces.

7. The electronic component according to claim 1, wherein the surface of each of the plurality of external terminal electrodes is entirely covered with a plating film.

8. A method of producing an electronic component comprising the steps of:
   preparing a ceramic green molded product having a plurality of terminal conductors, the plurality of the terminal conductors extending in the thickness direction over at least a portion of the thickness thereof;
   forming a via-hole having an elongated cross section along a line on which a plurality of the terminal conductors of the ceramic green molded product are arranged, the via-hole piercing the ceramic green molded product between first and second main surfaces thereof opposite to each other, wherein a portion of each of the plurality of the terminal conductors is exposed at the via-hole;
   firing the ceramic green molded product to obtain a ceramic sintered product; and
   splitting the ceramic sintered product along a splitting line passing through the via-hole, wherein the terminal conductors exposed on the inner wall of the via-hole are arranged In a recess portion formed by splitting the via-hole, such that the entire exposed portion of each of the plurality of terminal conductors defines a common flat surface with a surface of the recess portion, and the ceramic electronic component is divided.

9. The method of producing an electronic component according to claim 8, wherein the step of preparing the ceramic green molded product comprises laminating ceramic green sheets containing the ceramic green sheet having the plurality of the terminal conductors formed in the thickness direction thereof so as to pass through the ceramic green molded product.

10. The method of producing an electronic component according to claim 9, wherein the step of preparing the ceramic green molded product comprises forming conductor films and via-hole conductors for wiring on and in the ceramic green sheets.

11. The method of producing an electronic component according to claim 8, wherein the ceramic sintered product is an assembled electronic component from which a plurality of the electronic components are produced by splitting the sintered product along the split lines, the step of splitting the ceramic sintered product includes splitting the assembled electronic component, and in the step of forming the via-hole, the via-hole is formed so as to split the terminal conductors.

12. The method of producing an electronic component according to claim 11, further comprising the step of measuring the characteristics of each of the electronic components in the state of the assembled electronic component, before the assembled electronic component is split.

13. The method of producing an electronic component according to claim 8, further comprising the step of plating the surfaces of the external terminal electrodes before the step of splitting the ceramic sintered product.

14. The method of producing an electronic component comprising the steps of:
   preparing a ceramic green molded product having first and second main surfaces disposed opposite to each other;
   forming a via-hole having an elongated cross section which pierces the ceramic green molded product between the first and second main surfaces;
   firing the ceramic green molded product to obtain a ceramic sintered product;
   forming a plurality of external terminal electrodes on the ceramic green molded product or the ceramic sintered product so as to be arranged on the inner wail of the via-hole after the step of forming the via hole; and splitting the ceramic sintered molded product along a split line passing through the via-hole, wherein the plurality of the external electrodes formed on the inner wall of the via-hole are arranged in a recess portion formed by splitting the via-hole.

15. The method of producing an electronic component according to claim 14, wherein the step of preparing the ceramic green molded product comprises laminating a plurality of ceramic green sheets.

16. The method of producing an electronic component according to claim 15, wherein the step of preparing the ceramic green molded product comprises forming a conductor film or a via-hole conductor for wiring on the ceramic green sheets.

17. The method of producing a ceramic electronic component according to claim 14, wherein the ceramic sintered product is an assembled electronic component from which a plurality of the electronic components are produced by splitting along the split line, and the step of splitting the ceramic sintered product includes splitting the assembled electronic component.

18. The method of producing a ceramic electronic component according to claim 17, further comprising the step of measuring the characteristics of each of the electronic components in the state of the assembled electronic component before the step of splitting the assembled electronic component.

* * * * *